(12) United States Patent
Juliano et al.

(10) Patent No.: US 7,892,405 B1
(45) Date of Patent: *Feb. 22, 2011

(54) METHODS AND APPARATUS FOR MAGNETRON SPUTTERING

(75) Inventors: Daniel R. Juliano, Santa Clara, CA (US); Douglas B. Hayden, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 1072 days.

This patent is subject to a terminal disclaimer.

(21) Appl. No.: 11/654,250

(22) Filed: Jan. 17, 2007

Related U.S. Application Data

(63) Continuation of application No. 10/735,987, filed on Dec. 15, 2003, now Pat. No. 7,179,351.

(51) Int. Cl.
*C23C 14/35* (2006.01)

(52) U.S. Cl. .................. 204/192.12; 204/298.19; 204/298.2

(58) Field of Classification Search ............ 204/192.12, 204/298.17, 298.18, 298.19, 298.2
See application file for complete search history.

(56) References Cited

U.S. PATENT DOCUMENTS

| | | | | | |
|---|---|---|---|---|---|
| 4,631,106 | A | * | 12/1986 | Nakazato et al. | 156/345.46 |
| 6,132,576 | A | * | 10/2000 | Pearson | 204/298.2 |
| 6,613,199 | B1 | * | 9/2003 | Tobin et al. | 204/192.12 |
| 6,683,425 | B1 | * | 1/2004 | Lai | 315/500 |
| 7,179,351 | B1 | * | 2/2007 | Juliano et al. | 204/192.12 |

* cited by examiner

*Primary Examiner*—Rodney G McDonald
(74) *Attorney, Agent, or Firm*—Okamoto & Benedicto LLP

(57) ABSTRACT

In one embodiment, a magnetron sputtering apparatus forms a closed plasma loop and an open plasma loop within the closed plasma loop. The open plasma loop allows for relatively uniform erosion on the face of a target by broadening the sputtered area of the target. The open plasma loop may be formed and swirled using a rotating magnetic array to average the target erosion.

14 Claims, 12 Drawing Sheets

US 7,892,405 B1

METHODS AND APPARATUS FOR MAGNETRON SPUTTERING

REFERENCE TO RELATED APPLICATION

This application is a continuation of U.S. application Ser. No. 10/735,987, filed on Dec. 15, 2003, now U.S. Pat. No. 7,179,351, which is incorporated herein by reference in its entirety.

BACKGROUND OF THE INVENTION

1. Field of the Invention

The present invention relates generally to integrated circuit fabrication equipment, and more particularly but not exclusively to magnetron sputtering.

2. Description of the Background Art

Magnetron sputtering, in general, is well known in the art of integrated circuit fabrication. A magnetron sputtering apparatus includes a target comprising a material to be deposited on a substrate. The substrate, which may be a semiconductor wafer, is located a distance away from the target. To coat the substrate with the target material, a plasma of a gas suitable for sputtering is maintained between the target and the substrate. When ions of the sputtering gas hit the target, atoms of the target material are dislodged from the target and onto the substrate.

FIG. 1A schematically shows an example magnetron sputtering apparatus 100. Apparatus 100 includes a target 101 and a magnetic circuit comprising magnets 121, 122, and 123. Magnets 121, 122, and 123 and their respective magnetic fields 104 (i.e., 104-1, 104-2, . . . ) are cylindrically symmetric about a center line 112. A plasma loop 105 is maintained to sputter a target 101, which is a planar target in this example. A "plasma loop" comprises plasma formed in a region or path. In apparatus 100, magnets 121, 122, and 123 are configured such that magnetic fields 104 confine plasma loop 105. The effectiveness of the confinement depends on the strength of magnetic fields 104. However, in apparatus 100, electrons in plasma loop 105 have a tendency to diffuse to regions of weak magnetic fields and escape to the chamber walls. This makes it relatively difficult to maintain a high density plasma in front of target 101.

The sputtering track on a target generally follows the shape of the plasma loop formed over the target. For example, because ions from plasma loop 105 sputter target 101, target 101 is eroded only in areas under plasma loop 105. FIG. 1B is a plan view schematically showing a ring-shaped sputtering track formed by plasma loop 105 on target 101.

SUMMARY

In one embodiment, a magnetron sputtering apparatus forms a closed plasma loop and an open plasma loop within the closed plasma loop. The open plasma loop allows for relatively uniform erosion on the face of a target by broadening the sputtered area of the target. The open plasma loop may be formed and rotated using a rotating magnetic array to distribute the target erosion.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided such as examples of apparatus, components, and methods to provide a thorough understanding of embodiments of the invention. Persons of ordinary skill in the art will recognize, however, that the invention can be practiced without one or more of the specific details or by using alternatives. For example, magnets shown as permanent magnets may be replaced by electromagnets and vice versa. In other instances, well known details are not shown or described to avoid obscuring aspects of the invention.

Figure 1A:
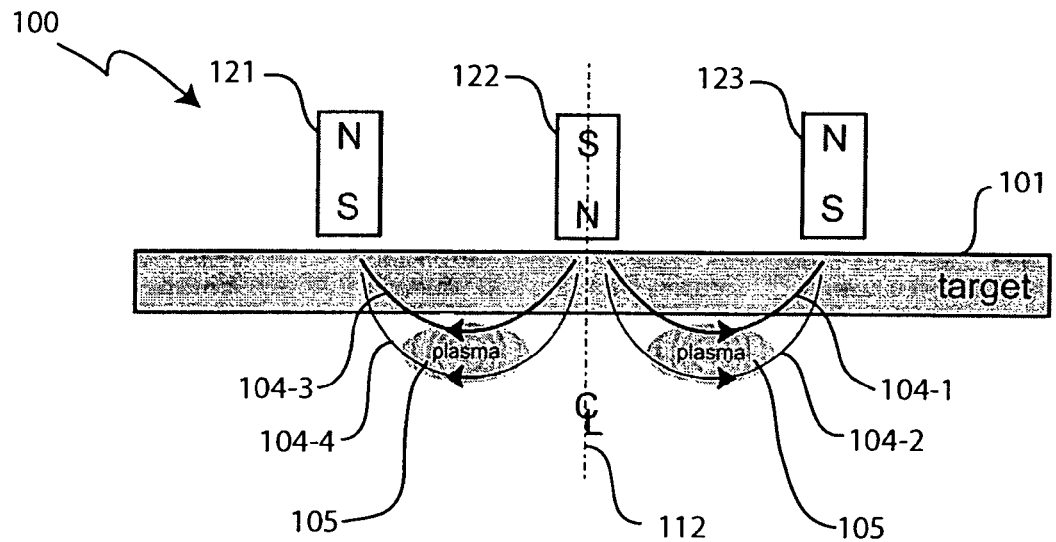
FIG. 1A schematically shows an example magnetron sputtering apparatus.
Figure 1B:
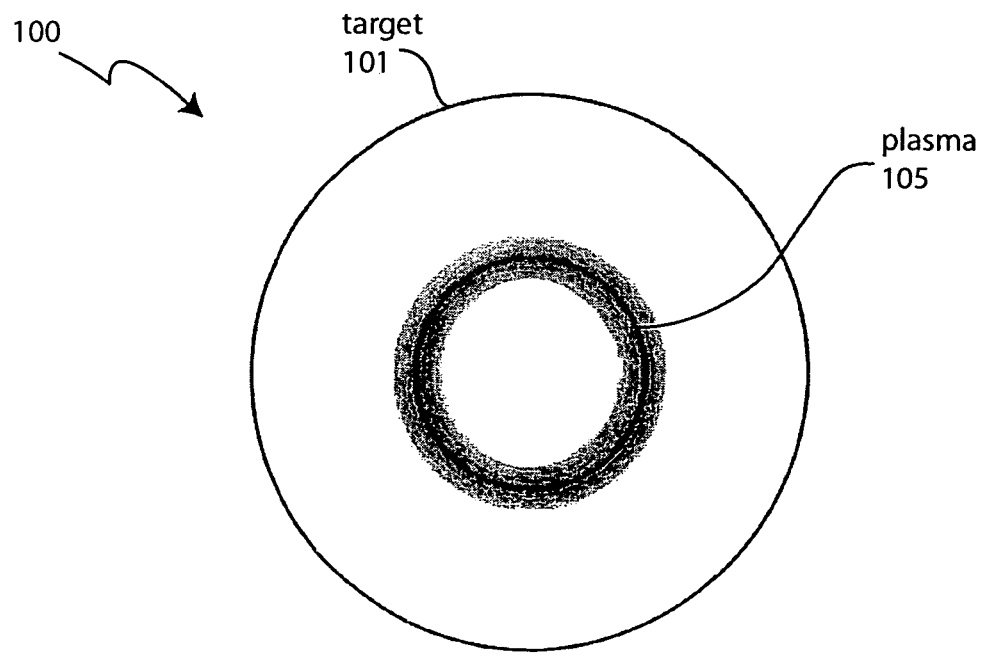
FIG. 1B is a plan view schematically showing a plasma loop formed by the apparatus of FIG. 1A.
Figure 2A:
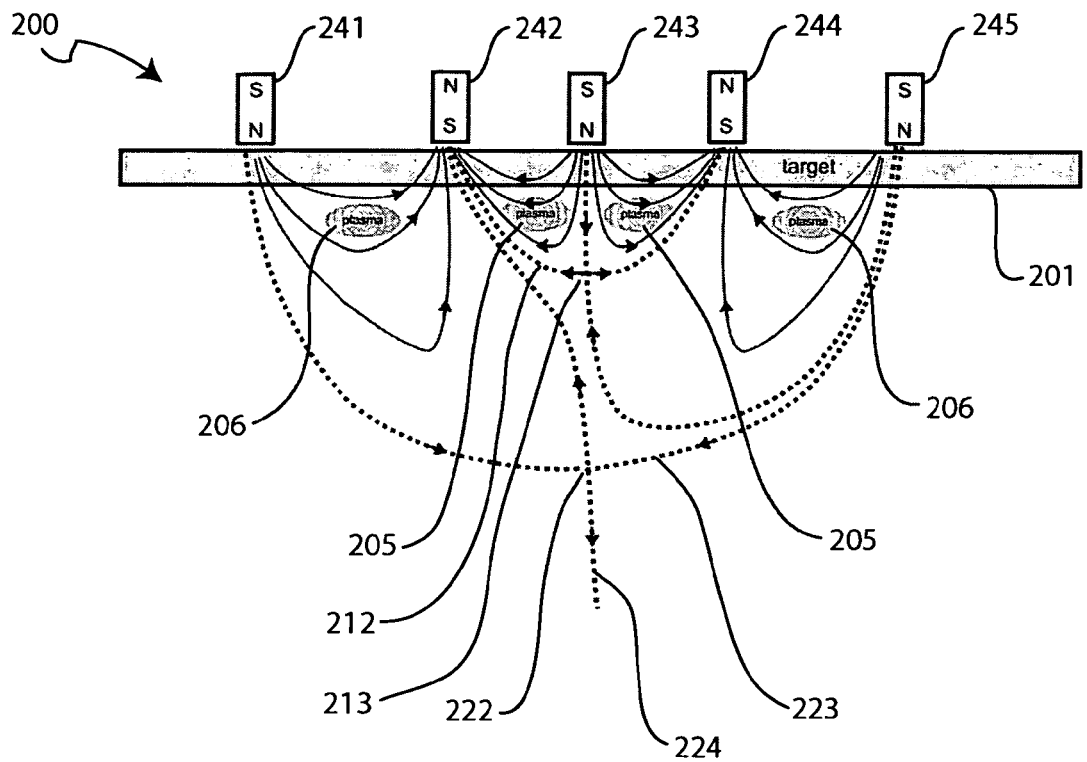
FIG. 2A schematically shows an example magnetron sputtering apparatus comprising one separatrix surface within another.

FIG. 2A schematically shows an example magnetron sputtering apparatus 200 comprising one separatrix surface within another. Apparatus 200 includes a planar target 201 and a magnetic circuit comprising magnets 241-245 (i.e., 241, 242, 243, 244, and 245). Magnets 241-245 and their magnetic fields are substantially cylindrically symmetric. The magnetic circuit of apparatus 200 is configured to generate a separatrix 212 and a separatrix 223. Generally speaking, a separatrix is a two-dimensional surface in three dimensions that divides a magnetic field into two regions. On either side of a separatrix, neighboring magnetic field lines remain roughly parallel to each other. But magnetic field lines that are on different sides of the separatrix will diverge, even if they are arbitrarily close at some point in space. A common (but not defining) feature of a separatrix surface is a region of low magnetic field, called the "null field" region. Plasma that is otherwise confined by the separatrix can escape out of the separatrix through a null region. In apparatus 200, electrons may escape through null regions 213 and 222 The formation and use of a separatrix in a magnetron sputtering apparatus are also disclosed in the following disclosures, which are incorporated herein by reference in their entirety: U.S. Pat. No. 5,482,611, U.S. Pat. No. 6,179,973, U.S. Pat. No. 6,444,105, U.S. Pat. No. 6,471,831, U.S. Pat. No. 6,497,796, U.S. Pat. No. 6,613,199, and U.S. application Ser. No. 10/068,772, entitled "Null-Field Magnetron Apparatus With Essentially Flat Target," filed by Kwok F. Lai on Feb. 5, 2002.

Apparatus 200 has several advantages. First, it has two separate plasma loops that can be optimized somewhat independently. Second, electrons of plasma loop 205 escaping out of separatrix 212 are recaptured by separatrix 223, effectively recycling the plasma and increasing the efficiency of apparatus 200.

Figure 2B:
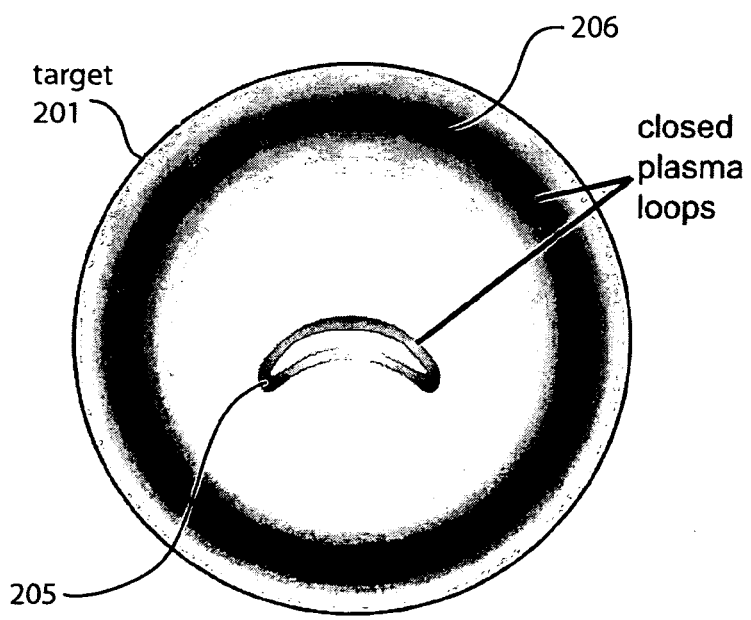
FIG. 2B is a plan view schematically showing the two plasma loops formed by the apparatus of FIG. 2A.

FIG. 2B schematically shows the sputtering tracks formed by plasma loops 205 and 206 on target 201. Plasma loops 205 and 206 are closed plasma loops in that the plasma flows along closed loop paths. The area of the target adjacent to the gap between plasma loops 205 and 206 on target 201 does not get eroded as much as the areas adjacent to the plasma loops. In some situations, this is the case even if plasma loop 205 is of various closed loop shapes (e.g., heart, slice of pie, kidney, etc.) and rotated. The formation and use of rotating magnetic fields in a magnetron sputtering apparatus are also disclosed in U.S. Pat. No. 5,314,597 and U.S. Pat. No. 6,193,854, which are incorporated herein by reference in their entirety.

FIGS. 3-6 are plan views schematically illustrating various combinations of open and closed plasma loops (and hence sputtering tracks) in accordance with embodiments of the present invention. The plasma loops of FIGS. 3-6 may be formed using any suitable magnetic circuit without detracting from the merits of the present invention. For example, a rotating magnetic array may be employed to form and rotate the plasmas to achieve relatively uniform erosion on the face of their respective targets. The targets may be hollow, planar, or of other shapes depending on the application. As can be appreciated, a hollow target may be a cup or cylindrically shaped target. Hollow target magnetrons are also disclosed in the incorporated disclosures U.S. Pat. No. 5,482,611, U.S. Pat. No. 6,179,973 and U.S. Pat. No. 6,613,199. In FIGS. 3-6, and in other figures of the present disclosure, the direction of plasma flow is indicated by arrows, and is primarily due to ExB (cross product of electric and magnetic fields) drift.

For purposes of the present disclosure, an "open plasma loop" refers to a plasma loop that takes plasma from a first region, siphons that plasma through the open loop, and then releases that plasma into a second region. The first and second regions, which are not part of the open plasma loop, may be the same region. As will be more apparent below, the just mentioned first and second regions may be a nearby volume, a closed plasma loop, or another open plasma loop.

Figure 3:
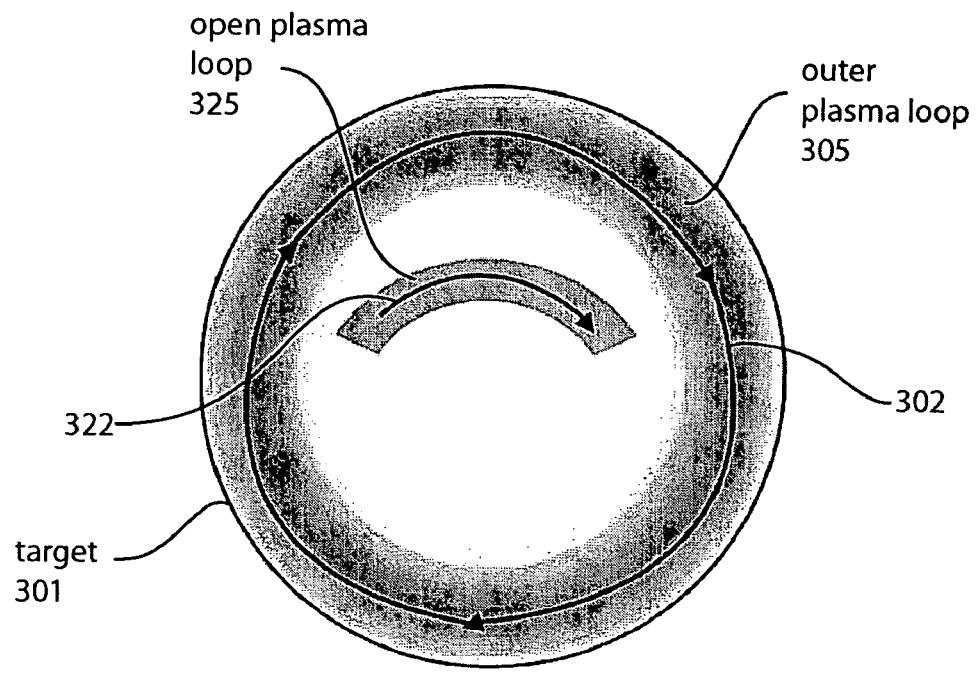
FIGS. 3-6 are plan views schematically showing various combinations of open and closed plasma loops in accordance with embodiments of the present invention.

In FIG. 3, a plasma loop 325 is formed within the separatrix confining plasma loop 305 over a target 301. Plasma loop 325 is an open plasma loop in that it takes plasma from a surrounding volume, siphons that plasma through plasma loop 325 in the direction indicated by an arrow 322, and then releases that plasma back to the surrounding volume. Plasma loop 305 is a closed plasma loop that flows in the direction indicated by an arrow 302.

Figure 4:
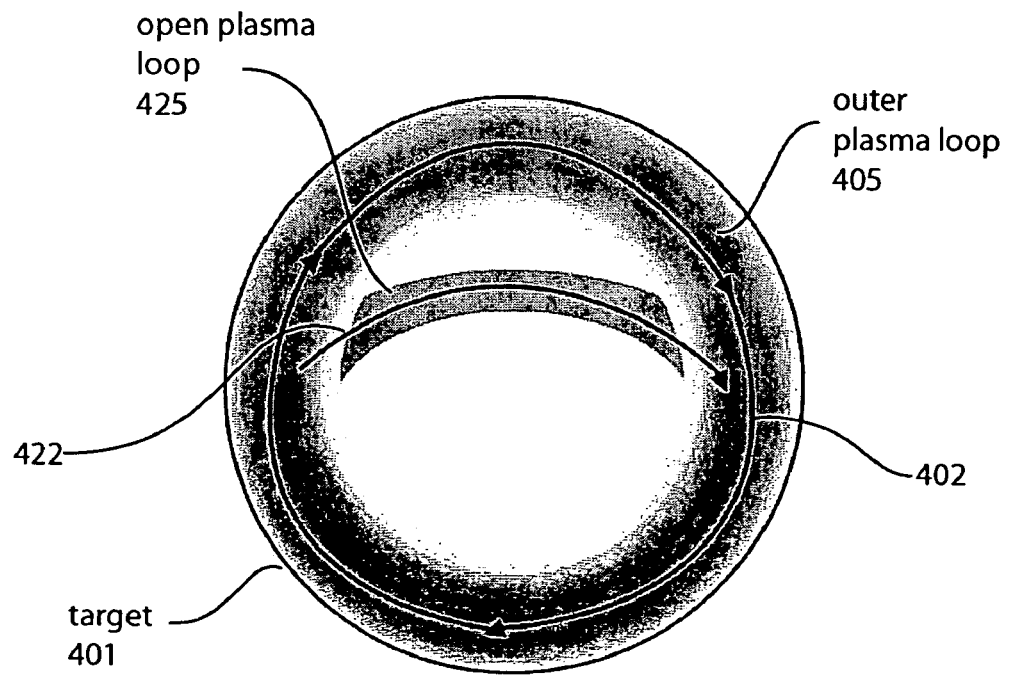

An open plasma loop can also be attached to a closed plasma loop to siphon plasma from the closed plasma loop on an alternate path across the target and back into the closed plasma loop. This is illustrated in FIG. 4, where open plasma loop 425 branches off closed plasma loop 405 across target 401 and back into closed plasma loop 405. Plasma loops 405 and 425 flow in the directions indicated by arrows 402 and 422, respectively.

In light of the present disclosure, those of ordinary skill in the art will appreciate that the above-described open plasma loops may be adapted to suit specific applications. For example, the teachings of the plasma topologies of FIGS. 3 and 4 may be combined to form an open plasma loop that siphons plasma from a closed plasma loop and releases the siphoned plasma into a nearby general volume, or siphons plasma from a general nearby volume and into a closed plasma loop.

Figure 5:
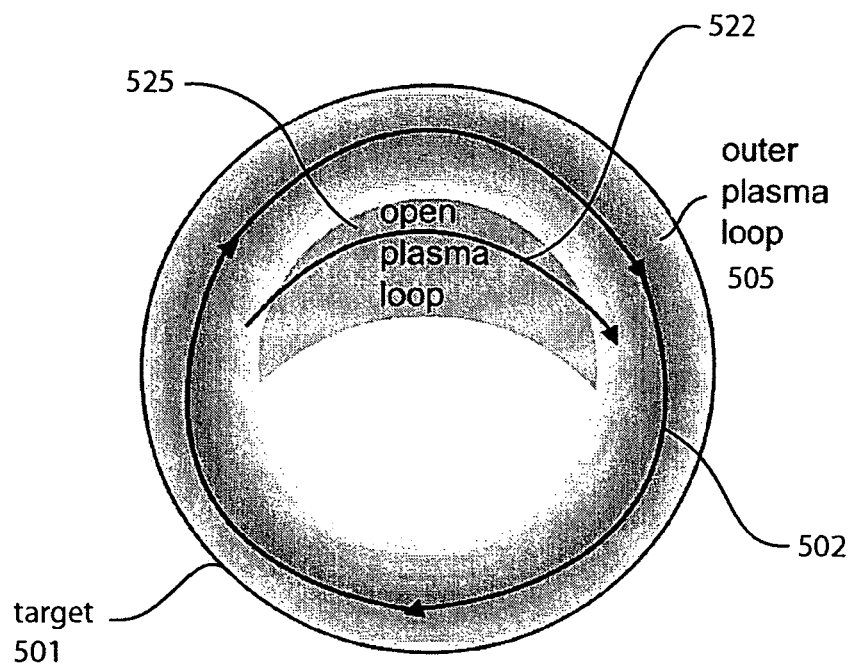

An open plasma loop may be employed in parallel with a closed plasma loop to broaden the area of the closed plasma loop. This is illustrated in FIG. 5 where plasma loop 525 is formed in parallel with and adjacent to a plasma loop 505 over a target 501. Open plasma loop 525 and closed plasma loop 505 flow in the direction indicated by arrows 522 and 502, respectively.

Figure 6:
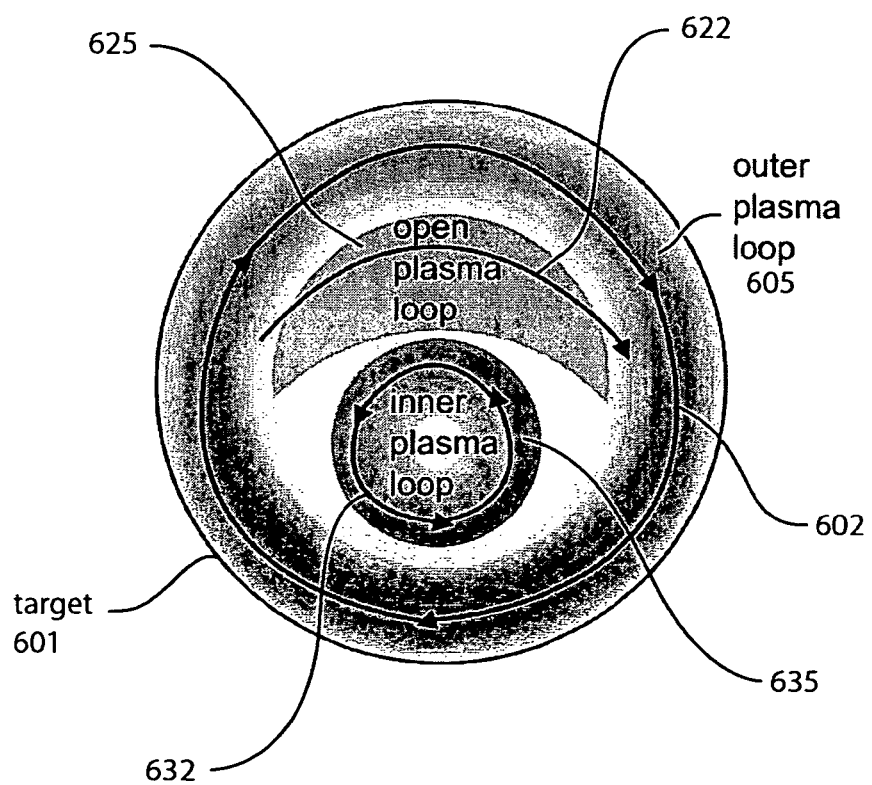

An open plasma loop may be employed in conjunction with one or more closed plasma loops. In FIG. 6, open plasma loop 625 contains plasma that flows in the direction indicated by an arrow 622, closed plasma loop 605 contains plasma that flows in the direction indicated by an arrow 602, and closed plasma loop 635 contains plasma that flows in the direction indicated by an arrow 632. Plasma loops 625 and 635 may be formed and rotated by a rotating magnetic array to average the erosion over the entire face of target 601.

Figure 7A:
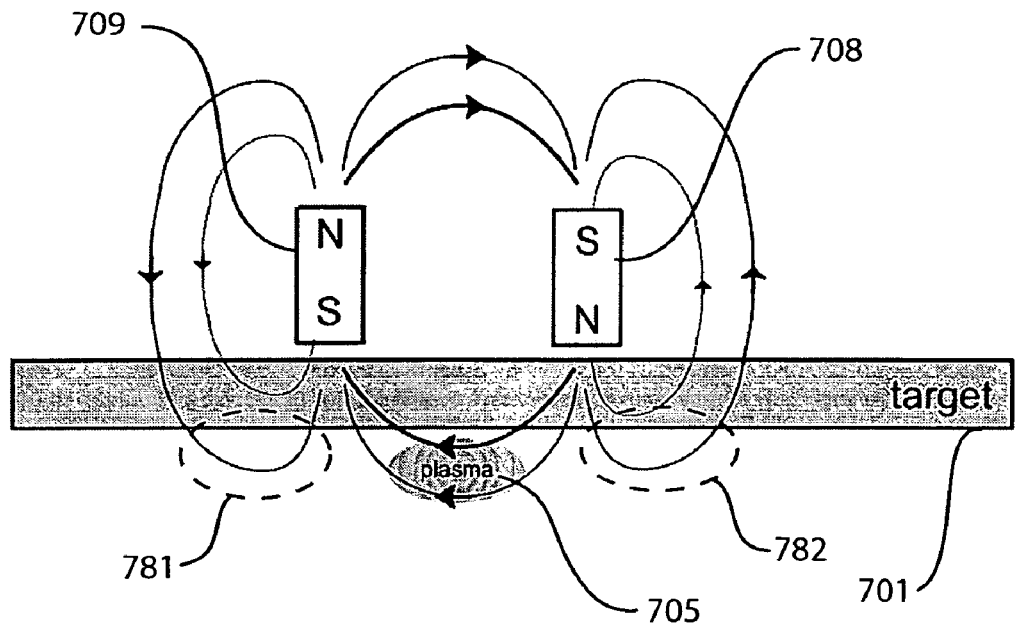
FIG. 7A schematically shows a magnetron sputtering apparatus employing perpendicularly oriented magnets to form an open plasma loop.
Figure 7B:
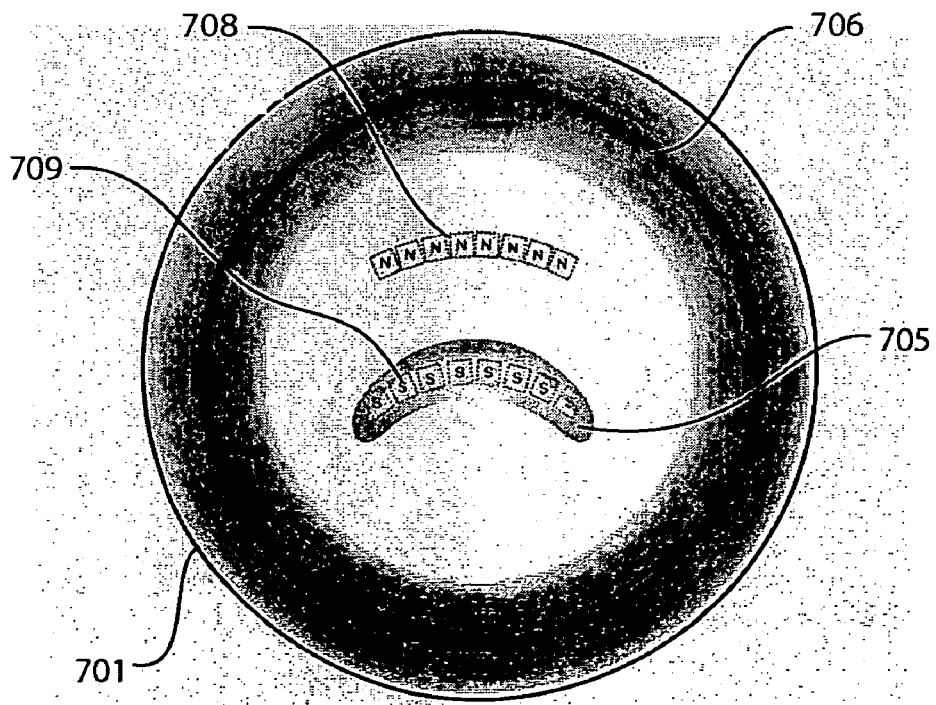
FIG. 7B is a plan view schematically showing the locations of a plasma loop and magnets relative to the target of the apparatus of FIG. 7A.

An open plasma loop may be formed using a magnetic circuit having individual magnets that are oriented perpendicular to the surface of the target. For example, as shown in FIG. 7A, magnets 708 and 709 may be configured such that a plasma loop 705 is an open plasma loop. However, depending on nearby magnetic circuits, auxiliary sputtering tracks may form in the field loops generally bounded by dashed lines 781 and 782 and provide a return path for plasma loop 705 (the main sputtering track). This may result in plasma loop 705 becoming a closed plasma loop instead of an open plasma loop. FIG. 7B is a plan view schematically showing the locations of plasma loop 705 and magnets 708 and 709 relative to target 701. Although magnets 708 and 709 provide parallel rows of opposite magnetic poles, a nearby prevailing magnetic "N" field (not shown) may couple with the "S" field of magnet 709 to form a closed plasma loop around magnet 709 as shown in FIG. 7B. Of course, this depends on whether there will be interfering magnetic field lines. Using perpendicularly oriented magnets, such as magnets 708 and 709, to form an open plasma loop may be feasible in some magnetic configurations (e.g., see rotating magnetic array 900 of FIGS. 9A and 9B).

Figure 8A:
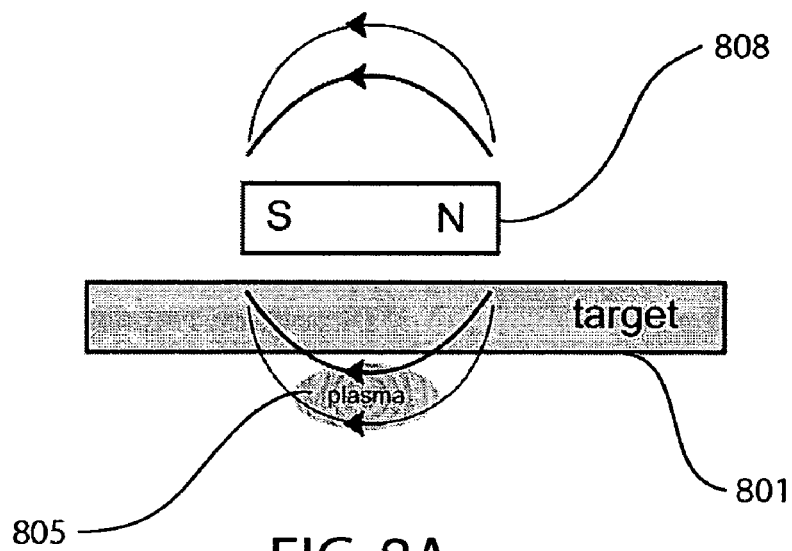
FIG. 8A schematically shows a magnetron sputtering apparatus employing magnets that are oriented parallel to a target to form an open plasma loop.
Figure 8B:
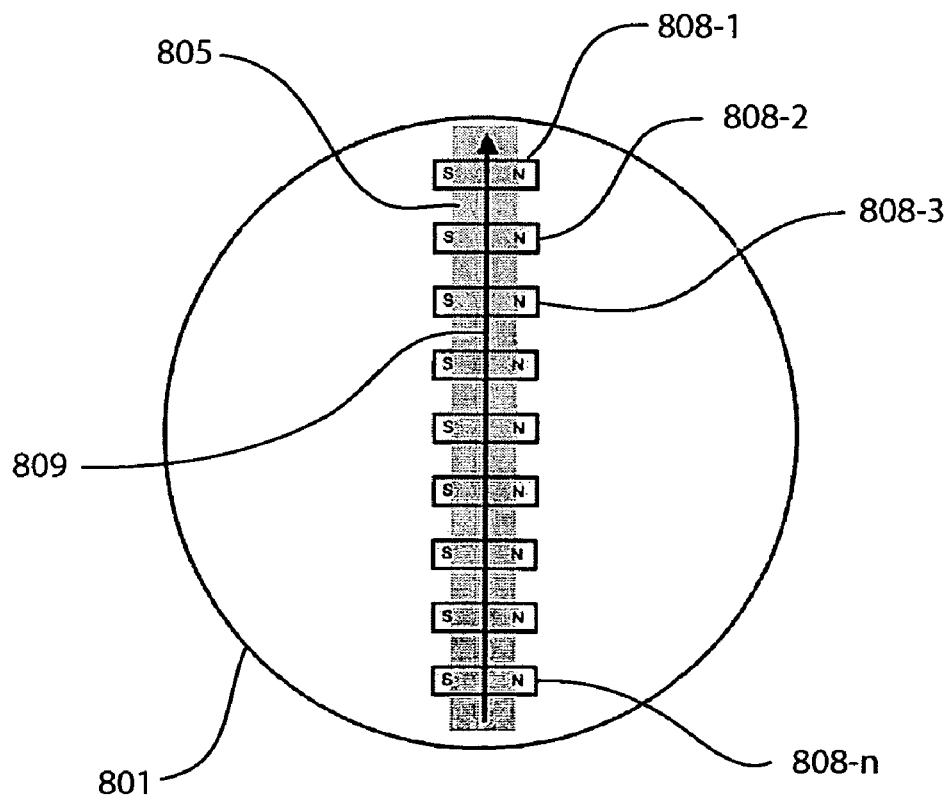
FIG. 8B is a plan view schematically showing the use of the apparatus of FIG. 8A to form an open plasma loop.

A relatively easier way of forming an open plasma loop is to employ magnets that are oriented parallel to the target surface. This embodiment of the present invention is schematically illustrated in FIG. 8A. In FIG. 8A, a magnet 808 is oriented parallel to a target 801. Because there are no field loops on either side of plasma loop 805, the chances of having an unintended auxiliary track is decreased. Several magnets 808 (i.e., 808-1, 808-2, . . . ) may be placed side by side to form a continuous open loop path as shown in the plan view of FIG. 8B. FIG. 8B shows the locations of magnets 808 and plasma loop 805 relative to target 801. In FIG. 8B, plasma loop 805 flows across target 801 in the direction indicated by an arrow 809. Magnets 808 may be configured to achieve a particular type of open plasma loop. In the interest of clarity, FIG. 8A does not show all of the magnetic components. For example, in order to form a self-sustaining magnetron plasma, it may be necessary to employ additional magnets to enclose plasma 809 within a separatrix surface containing a closed plasma loop.

Figure 9A:
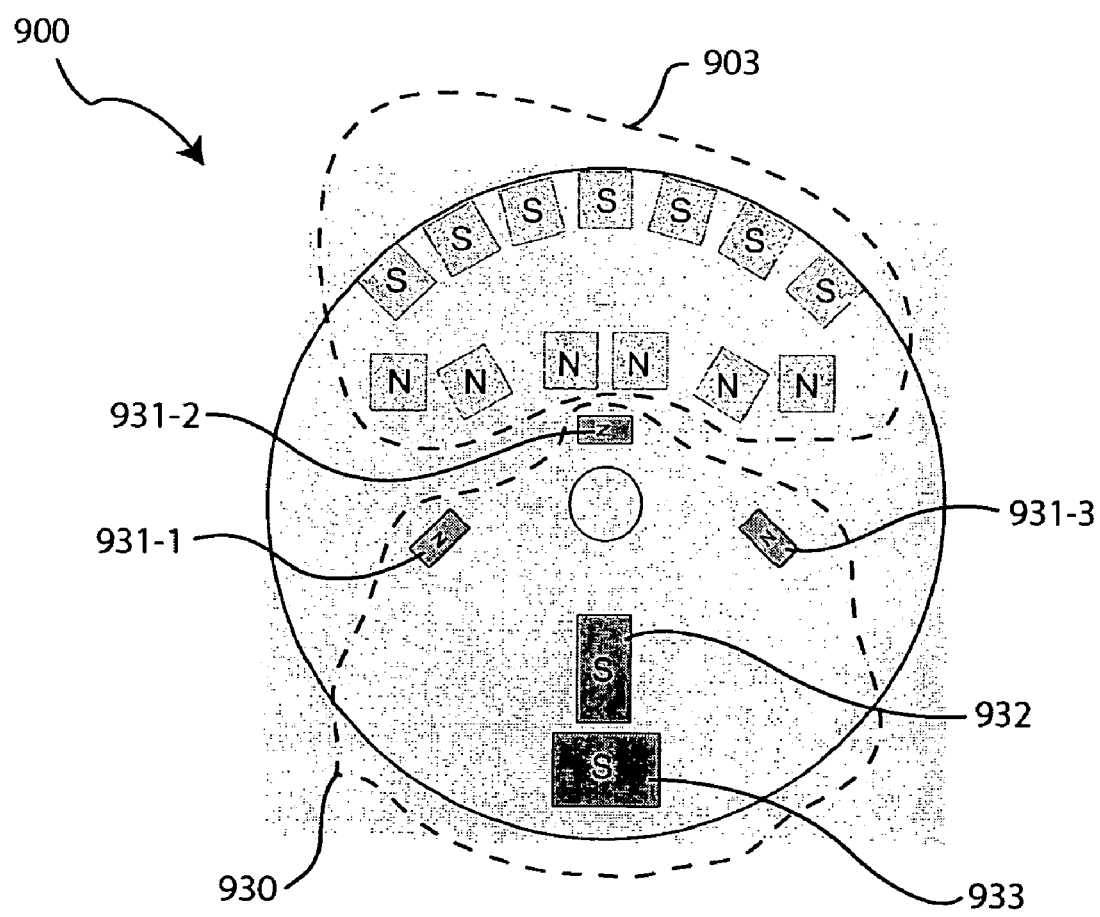
FIGS. 9A and 9B are plan views schematically showing rotating magnetic arrays in accordance with embodiments of the present invention.
Figure 9B:
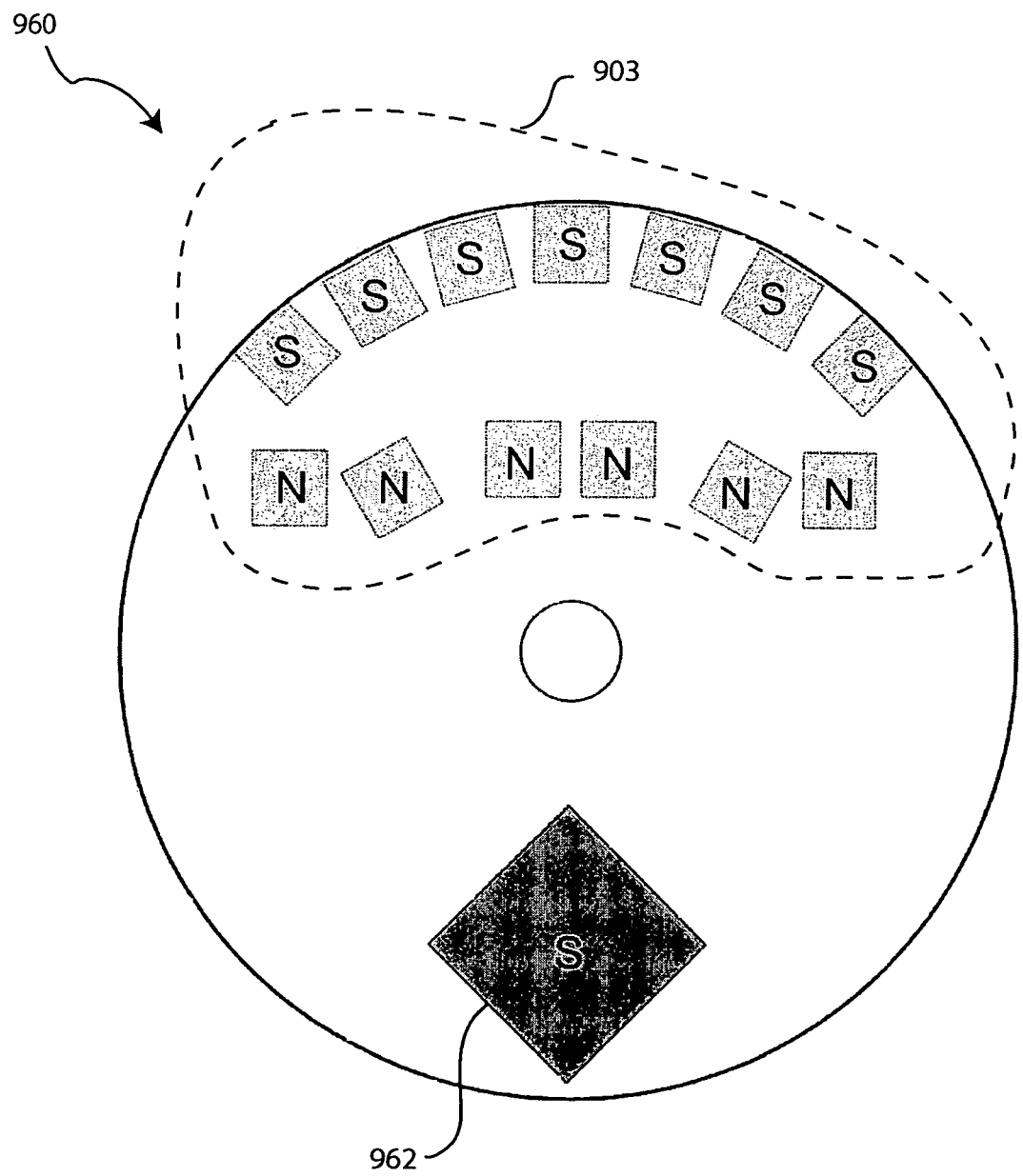

FIG. 9A is a plan view schematically showing a rotating magnetic array 900 in accordance with an embodiment of the present invention. Array 900 includes magnetic circuits 903 and 930, which both comprise magnets oriented perpendicularly to the face of the target (not shown). FIG. 9A shows the poles of the magnets of magnetic circuits 903 and 930 as "seen" by the target. Magnetic circuit 903 is configured to form an open plasma loop similar to plasma loop 625 shown in FIG. 6, while magnetic circuit 930 is configured to form an inner closed plasma loop similar to plasma 635 also shown in FIG. 6. Magnets 932 and 933 of magnetic circuit 930 interact with a prevailing "N" field (e.g., those from magnets 1002 and 1003 shown in FIG. 10A) and magnetic fields generated by magnets 931 (i.e., 931-1, 931-2, . . . ) to form an inner closed plasma loop. FIG. 9B is a plan view schematically showing a rotating magnetic array 960 in accordance with an embodiment of the present invention. Magnetic array 960 is similar in operation to magnetic array 900. Both magnetic arrays 900 and 960 employ a magnetic circuit 903, configured to form an open plasma loop similar to plasma loop 625 shown in FIG. 6. In the embodiment shown in FIG. 9A, magnets 932 and 933 interact with magnets 931 (i.e., 931-1, 931-2, . . . ) and a locally prevailing N magnetic field to form a closed plasma loop similar to loop 635 shown in FIG. 6. In the embodiment shown in FIG. 9B, magnet 962 serves the same purpose as magnets 932 and 933 in FIG. 9A, interacting with the prevailing N field to form a closed plasma loop similar to loop 635 shown in FIG. 6. In the embodiment shown in FIG. 9B, there are no magnets analogous to magnets 931 in FIG. 9A. These magnets are not required to form a closed plasma loop, but can be useful for fine tuning the erosion of the target.

Figure 10A:
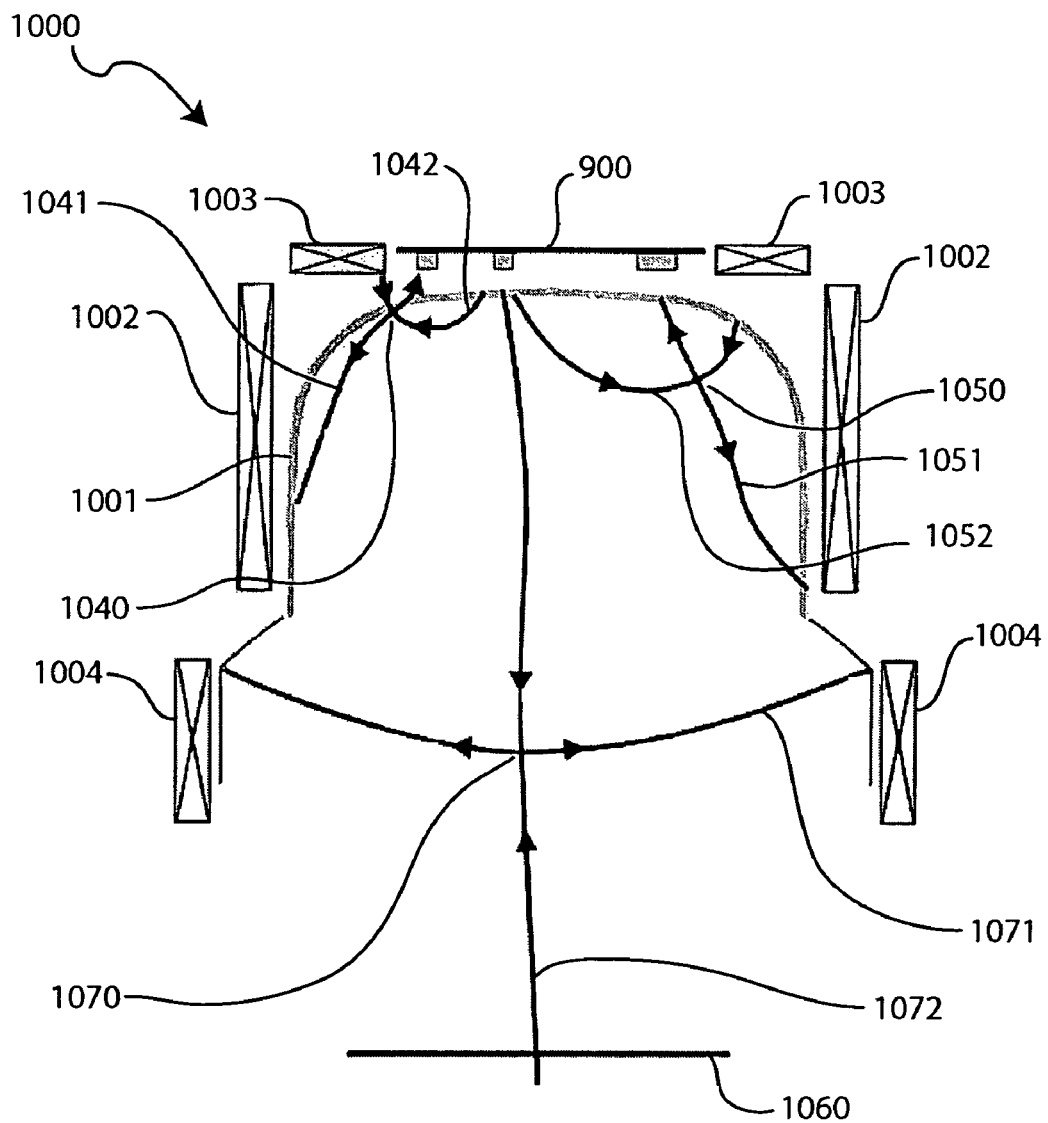
FIG. 10A schematically shows a magnetron sputtering apparatus in accordance with an embodiment of the present invention.

FIG. 10A shows a magnetron sputtering apparatus 1000 in accordance with an embodiment of the present invention. Apparatus 1000 includes magnetic array 900 (see FIG. 9A). Magnetic array 900 may be rotated using a motor, for example, to average the erosion profile on a hollow target 1001. In apparatus 1000, target 1001, an auxiliary magnet 1003, a main magnet 1002, and a control magnet 1004 are cylindrically symmetric. The teachings of the present disclosure may be employed together with the teachings of the incorporated U.S. Pat. Nos. 6,497,796, 6,179,973, and 6,193,854 to build apparatus 1000. It should be understood, however, that the present invention is not so limited and may be generally employed in other magnetron sputtering apparatus.

In apparatus 1000, magnets 1002 and 1004 generate magnetic fields to form a separatrix 1071 that confine an outer closed plasma loop (e.g., see plasma loop 605 shown in FIG. 6). Plasma confined by separatrix 1071 escapes out of target 1001 through a null region 1070 generally along the path of a magnetic field line 1072. Some of the escaping ions get deposited on a substrate 1060, which may be a semiconductor wafer. The magnetic field strength of control magnet 1004, which may be an electromagnet, may be varied to control the shape of separatrix 1071 and thereby affect the profile of the escaping plasma.

Auxiliary magnet 1003 and the magnetic circuits of magnetic array 900 are configured to form a separatrix 1042 and a separatrix 1052. Separatrix 1042 and separatrix 1052 pass through null regions 1040 and 1050, respectively. Plasma may escape out of separatrix 1042 by following the path of a magnetic field line 1041. Similarly, plasma may escape out of separatrix 1052 by following the path of a magnetic field line 1051.

Figure 10B:
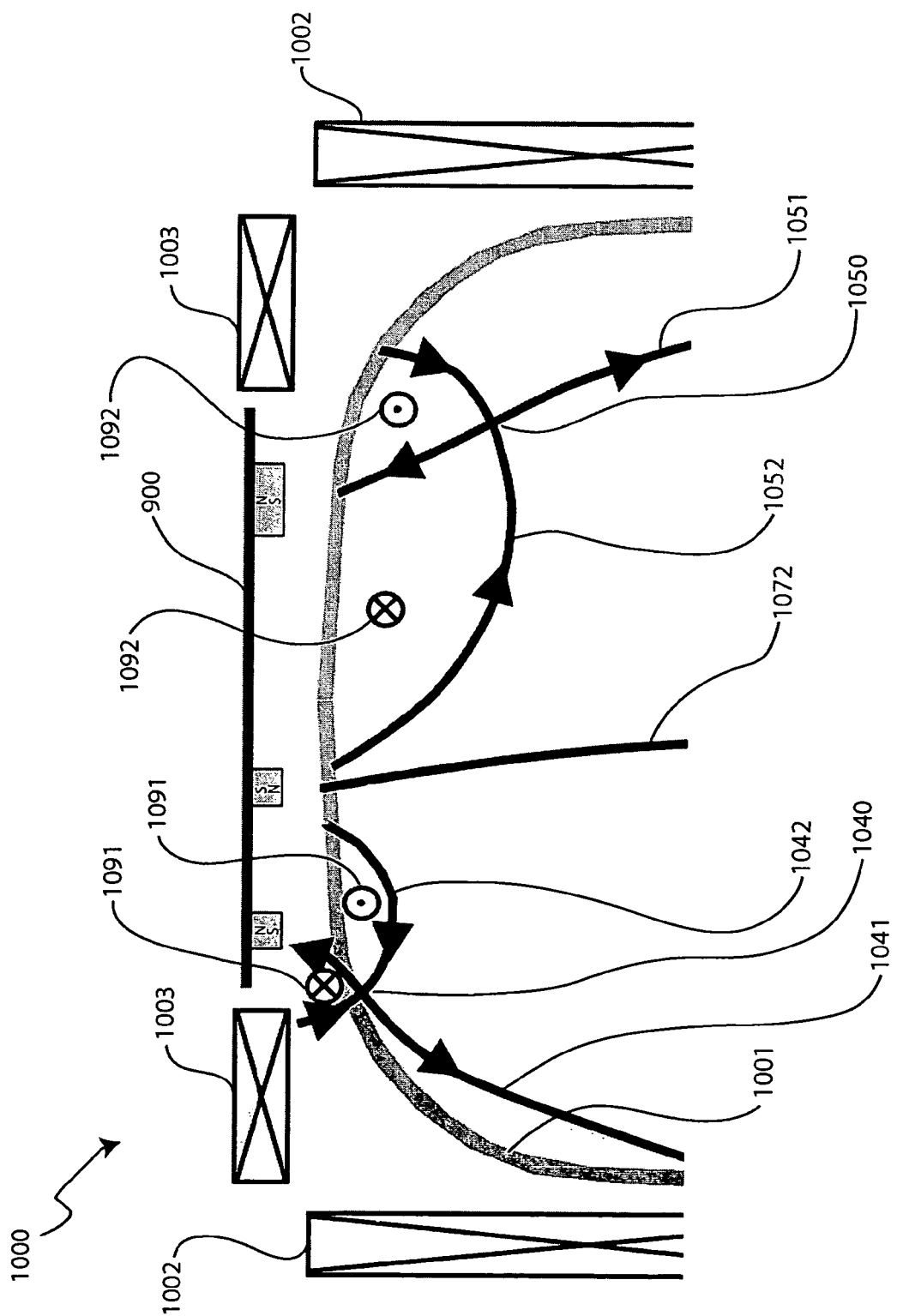
FIG. 10B shows a magnified view of the apparatus of FIG. 10A.

FIG. 10B shows a magnified view of the top portion of apparatus 1000. As shown in FIG. 10B, separatrix 1042 is formed such that it is cut off by the face of target 1001. This results in a plasma loop 1091 that would otherwise flow going into the page of FIG. 10B (see the circled X labeled 1091) and coming out of the page of FIG. 10B (see the circled dot labeled 1091) to be also cut off. Plasma loop 1091 does not have a return path and thus becomes an open plasma loop flowing in only one direction across target 1001 (see plasma loop 625 of FIG. 6). On the other hand, separatrix 1052 is not cut off. This allows plasma loop 1092 confined by separatrix 1052 to flow in a direction going into the page of FIG. 10B (see circled X labeled 1092) and coming out of the page of FIG. 10B (see circled dot labeled 1092). Plasma loop 1092 has an unblocked return path and is thus a closed plasma loop (see plasma 635 of FIG. 6). The other labeled features in FIG. 10B have already been introduced and discussed in connection with FIG. 10A.

Figure 11:
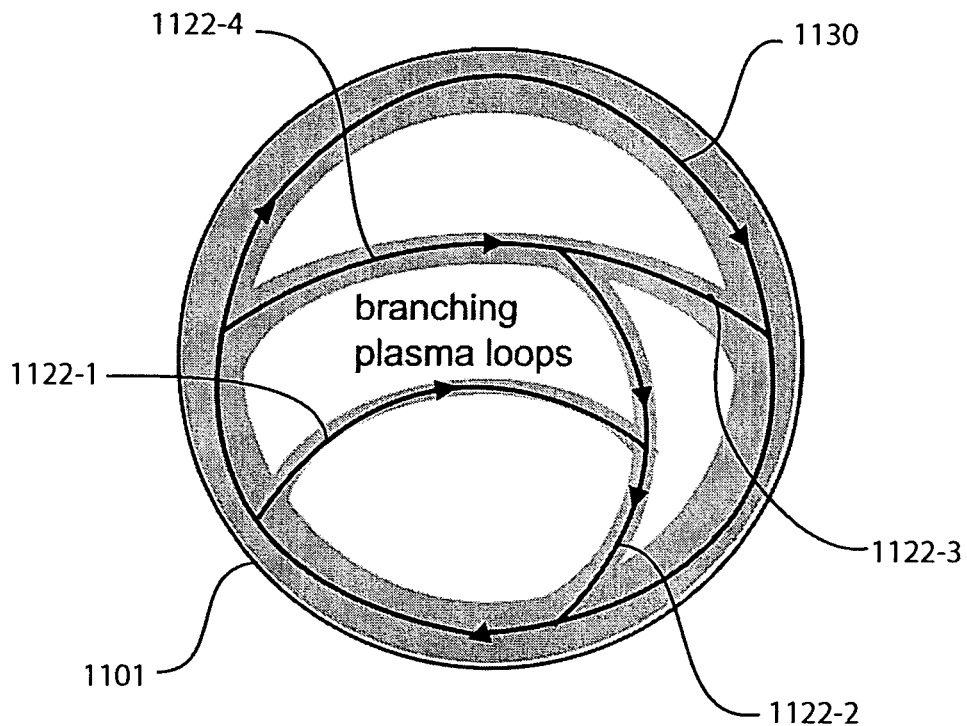
FIG. 11 is a plan view schematically showing branching plasma loops in accordance with an embodiment of the present invention.
Figure 12:
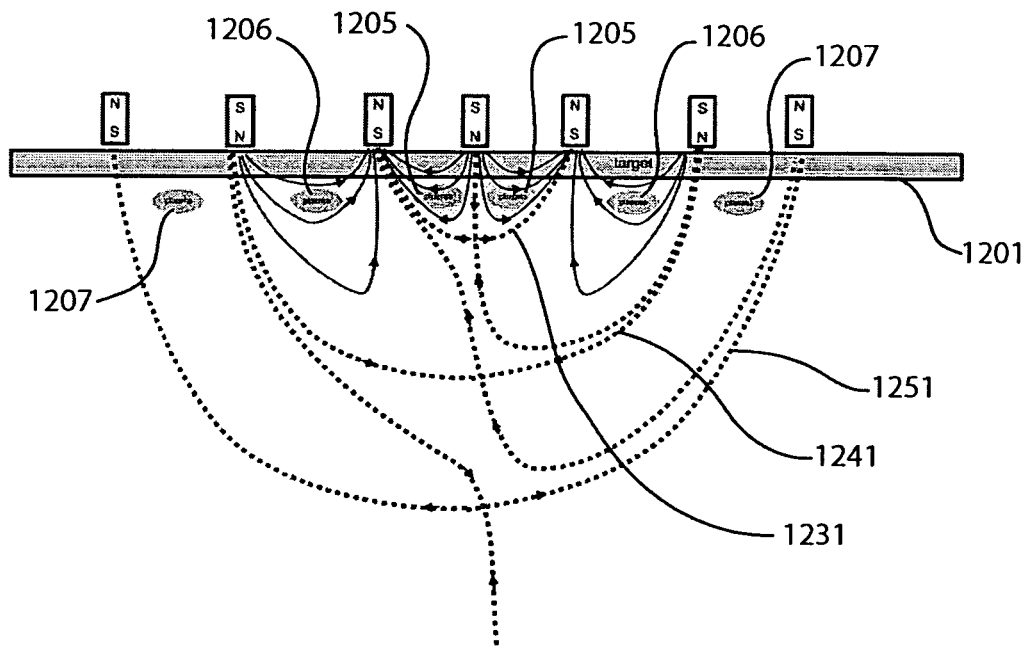
FIGS. 12 and 13 schematically show magnetron sputtering apparatus in accordance with embodiments of the present invention.
Figure 13:
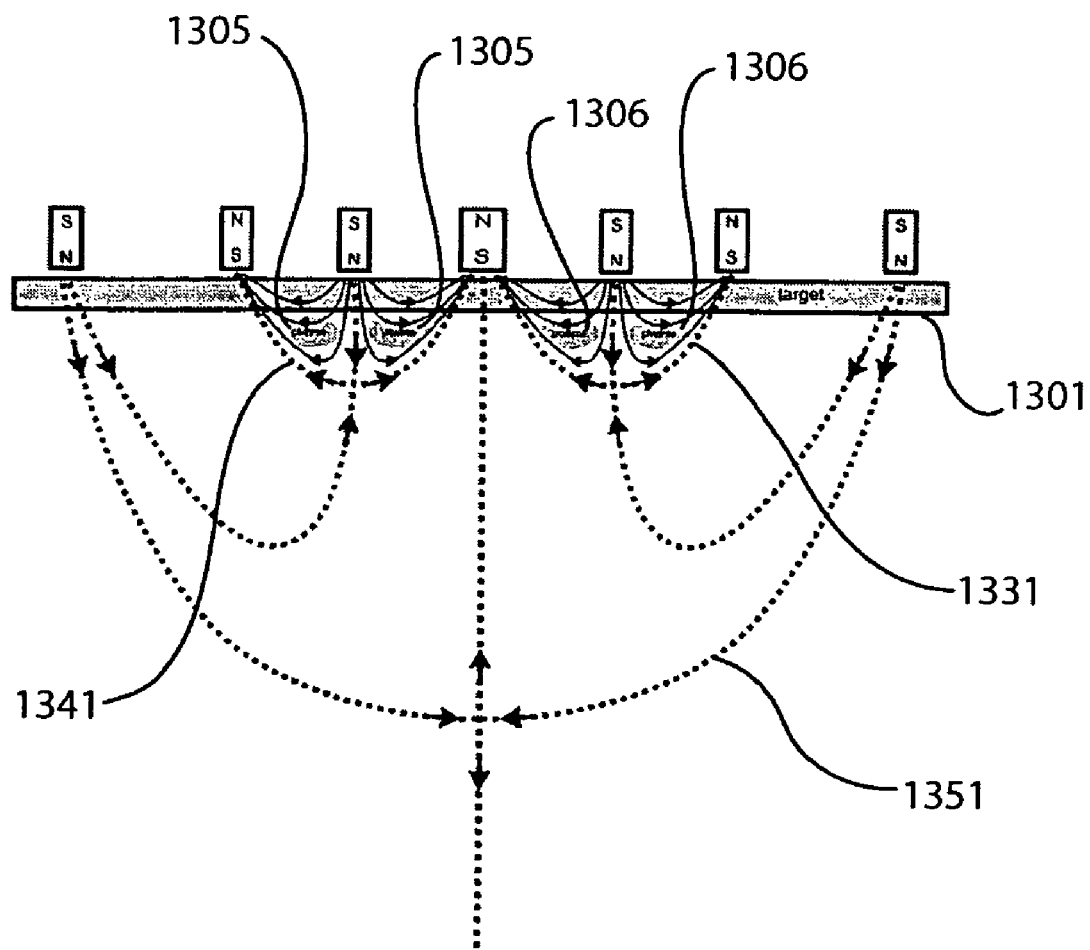

While specific embodiments of the present invention have been provided, it is to be understood that these embodiments are for illustration purposes and not limiting. Many additional embodiments will be apparent to persons of ordinary skill in the art reading this disclosure. For example, referring to FIG. 11, the teachings of the present disclosure may be employed to form multiple branching open plasma loops flowing in the directions indicated by arrows 1122 (i.e., 1122-1, 1122-2, . . . ) over a target 1101. In FIG. 11, a closed plasma loop flows in the direction indicated by an arrow 1130. Furthermore, the recycling of plasma from one confinement region into another confinement region may be extended to any number of confinement regions. For example, FIG. 12 schematically shows a separatrix 1231 confining a plasma loop 1205, which is within a separatrix 1241 confining a plasma loop 1206, which in turn is within a separatrix 1251 confining a plasma loop 1207 over a target 1201. In FIG. 12, plasma escaping from separatrix 1231 may be captured and recycled by separatrix 1241. Similarly, plasma escaping from separatrix 1241 may be captured and recycled by separatrix 1251. It is also not necessary for each layer of separatrix to be concentric. For example, FIG. 13 shows a separatrix 1341 confining a plasma loop 1305, and a separatrix 1331 confining a plasma loop 1306. As shown in FIG. 13, separatrices 1331 and 1341 are not concentric and are both within a separatrix 1351. The present invention is thus limited only by the following claims.

What is claimed is:

1. A method of magnetron sputtering, the method comprising:
   forming a first separatrix to confine a first plasma, the first separatrix comprising a first null region through which ions may escape through;
   forming a second separatrix to confine the first separatrix, the second separatrix comprising a second null region through which ions may escape through;
   confining the second separatrix within a third separatrix, the third separatrix comprising a third null region through which ions may escape through; and
   depositing a thin film on a substrate with ions escaping through the first null region of the first separatrix and the second null region of the second separatrix;
   wherein ions escaping through the second null region of the second separatrix pass through the third null region of the third separatrix to deposit onto the substrate.

2. The method of claim 1 wherein ions escaping through the third null region of the third separatrix are sputtered off a hollow target.

3. The method of claim 1 wherein the ions escaping through the third null region of the third separatrix are sputtered off a planar target.

4. A method of magnetron sputtering, the method comprising:
generating a first closed plasma loop;
forming a separatrix surface to generate an open plasma loop within the first closed plasma loop; and
sputtering a target with ions from the open plasma loop and the closed plasma loop.

5. The method of claim 4 further comprising:
generating a second closed plasma loop within the first closed plasma loop.

6. The method of claim 4 wherein the open plasma loop flows in the same direction as the first closed plasma loop.

7. The method of claim 4 wherein the target comprises a planar target.

8. The method of claim 4 wherein the target comprises a hollow target.

9. The method of claim 4 further comprising:
generating a rotating magnetic field to rotate the open plasma loop.

10. A magnetron sputtering apparatus comprising:
a first magnetic circuit configured to generate a first separatrix having a first null region;
a second magnetic circuit configured to generate a second separatrix having a second null region, the second separatrix confining the first separatrix; and
a target configured to be sputtered to generate ions that pass through the first null region of the first separatrix and then through the second null region of the second separatrix to deposit onto a substrate;
wherein the first and second magnetic circuits are part of a rotating magnetic array.

11. The apparatus of claim 10 wherein the target comprises a planar target.

12. The apparatus of claim 10 wherein the target comprises a hollow target.

13. The apparatus of claim 10 wherein the rotating magnetic array comprises:
a first set of magnets oriented parallel to a surface of the target, wherein the first set of magnets generate an open plasma loop.

14. The apparatus of claim 10 wherein the rotating magnetic array comprises:
a first set of magnets oriented perpendicular to a surface of the target, wherein the first set of magnets generate an open plasma loop.

* * * * *